United States Patent
Yamada

(10) Patent No.: US 6,773,945 B2
(45) Date of Patent: Aug. 10, 2004

(54) METHOD OF MANUFACTURING A WAVEGUIDE OPTICAL SEMICONDUCTOR DEVICE

(75) Inventor: Koji Yamada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/212,170

(22) Filed: Aug. 6, 2002

(65) Prior Publication Data

US 2003/0064536 A1 Apr. 3, 2003

(30) Foreign Application Priority Data

Sep. 28, 2001 (JP) .......................................... 2001-299285
Feb. 26, 2002 (JP) .......................................... 2002-050263

(51) Int. Cl.[7] .............................................. H01L 21/00
(52) U.S. Cl. .............................. 438/31; 438/39; 438/42
(58) Field of Search ............................. 438/31, 39, 40, 438/42, 43, 29, 32

(56) References Cited

U.S. PATENT DOCUMENTS

| | | | | |
|---|---|---|---|---|
| 4,788,159 A | * | 11/1988 | Smith ........................... | 438/43 |
| 5,723,360 A | * | 3/1998 | Iwasaki ........................ | 438/41 |
| 5,764,842 A | * | 6/1998 | Aoki et al. .................. | 385/131 |
| 5,770,474 A | * | 6/1998 | Kim .............................. | 438/31 |
| 5,834,329 A | * | 11/1998 | Kim et al. ..................... | 438/40 |
| 5,880,487 A | * | 3/1999 | Furukawa et al. ............ | 257/99 |
| 6,200,826 B1 | * | 3/2001 | Kim .............................. | 438/31 |
| 6,323,530 B1 | * | 11/2001 | Kubota ........................ | 257/466 |
| 6,374,028 B2 | * | 4/2002 | Yamada et al. ............. | 385/131 |
| 6,459,840 B1 | * | 10/2002 | Sato et al. ................... | 385/129 |

FOREIGN PATENT DOCUMENTS

| | | |
|---|---|---|
| JP | 07-230067 | 8/1995 |
| JP | 11-202274 | 7/1999 |
| JP | 2001-091913 | 4/2001 |

OTHER PUBLICATIONS

Yukio Noda et al., "High–Speed Electroabsorption Modulator with Strip–Loaded GaInAsP Planar Waveguide," Journal of Lightwave Technology, vol. LT–4, No. 10, Oct. 1986, pp. 1445–1453.

* cited by examiner

Primary Examiner—Matthew Smith
Assistant Examiner—Lex H. Malsawma
(74) Attorney, Agent, or Firm—Volentine Francos, PLLC

(57) ABSTRACT

A method of manufacturing a waveguide optical semiconductor device provides a semiconductor substrate including a lower clad layer, a core layer, an upper clad layer and a contact layer formed on the substrate in order. The contact layer and a part of the upper clad layer are removed by dry etching between a pair of parallel line patterns and at an independent rectangular pattern located near the line patterns. Then, the remaining upper clad layer is removed by wet etching so as to expose the core layer within the line patterns and the independent rectangular pattern. An insulating material is coated on the exposed core layer. The insulating material formed on the contact layer is removed within a region located between the pair of line patterns so that a part of the contact layer is exposed. An electrode layer is formed on the exposed contact layer. Finally, a bonding pad layer is formed over the independent rectangular pattern and a part of the electrode layer.

20 Claims, 8 Drawing Sheets

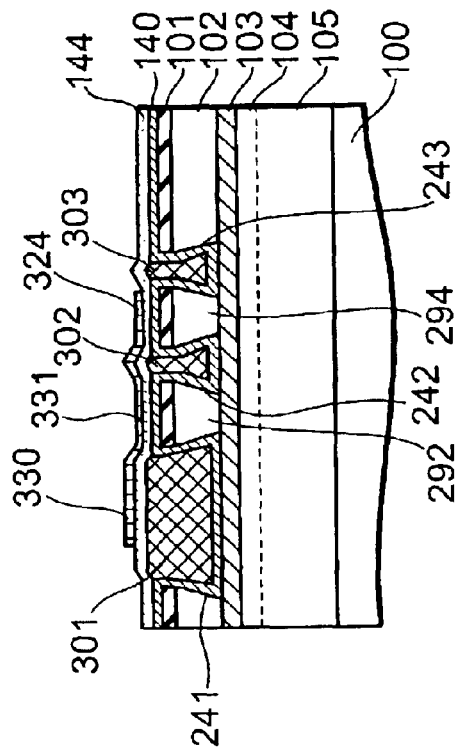
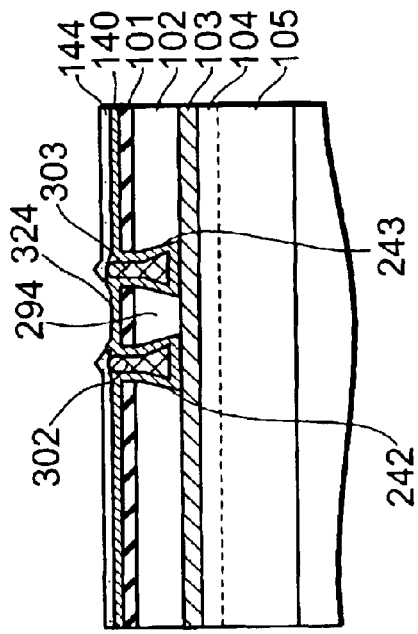
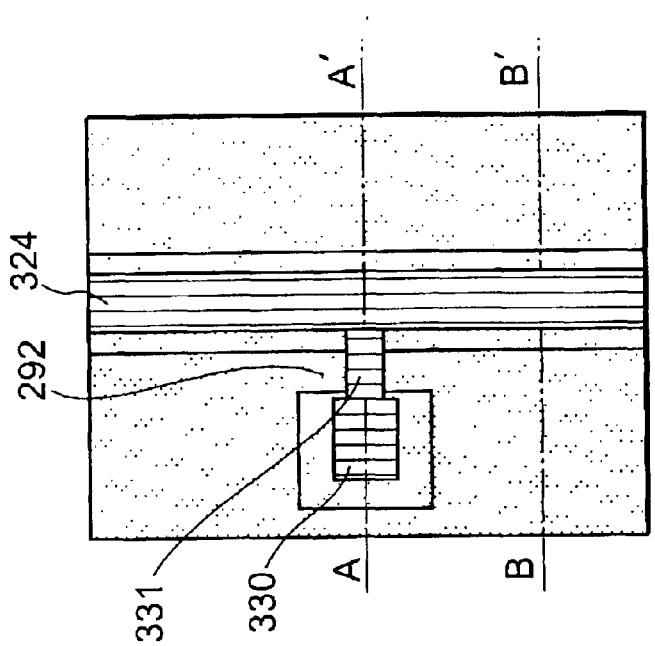
FIG.1(a)
FIG.1(b)
FIG.1(c)

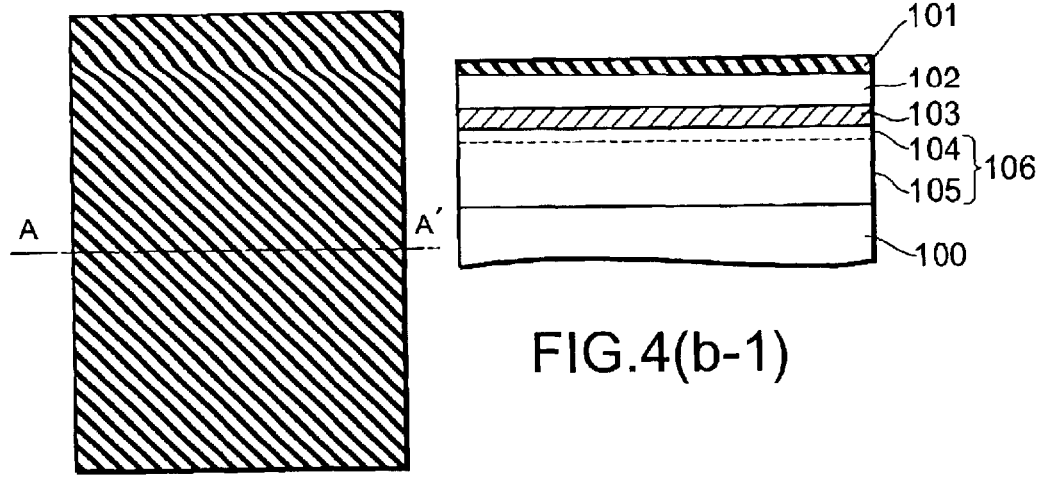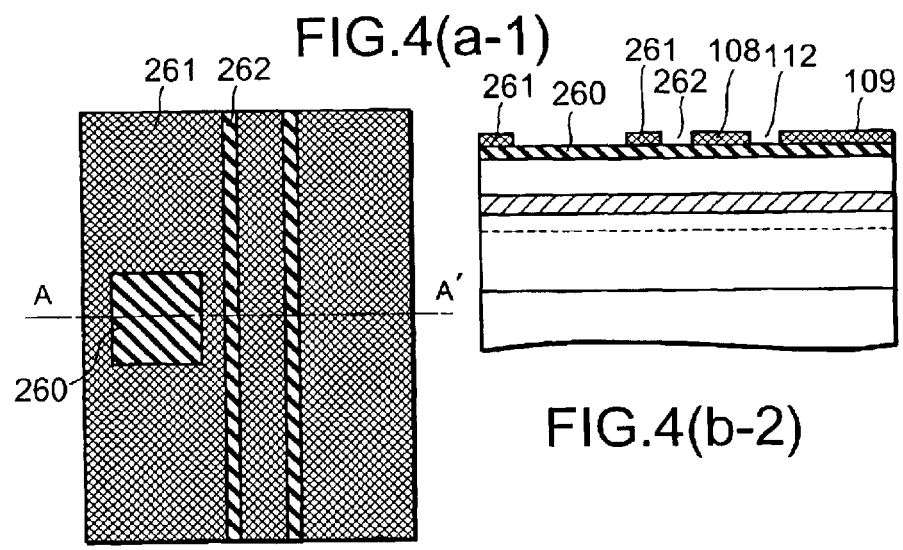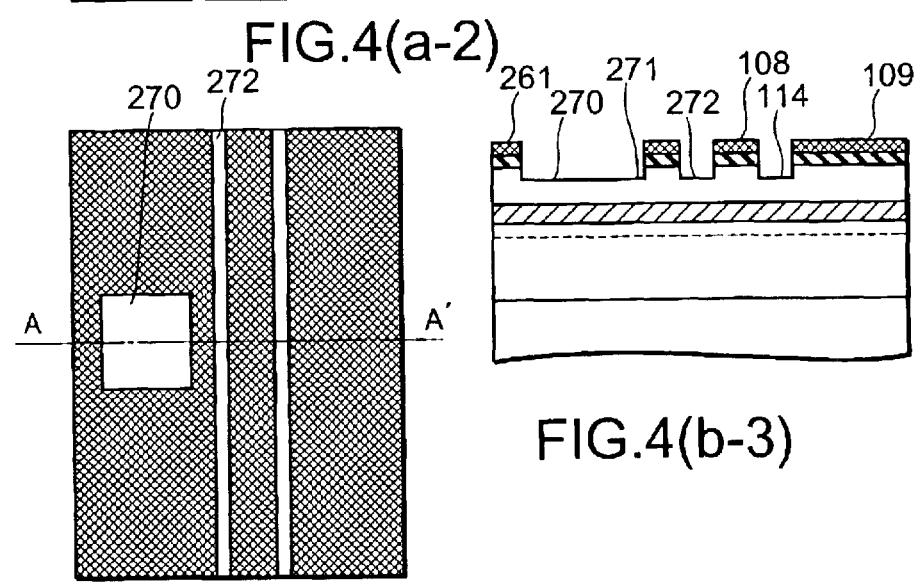

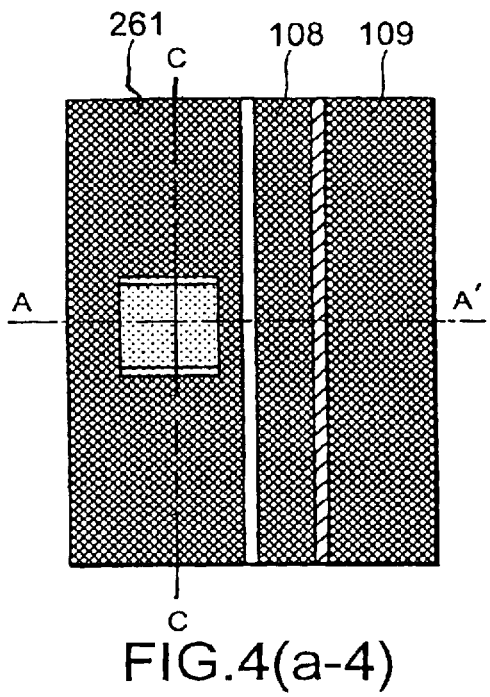
FIG.4(a-4)
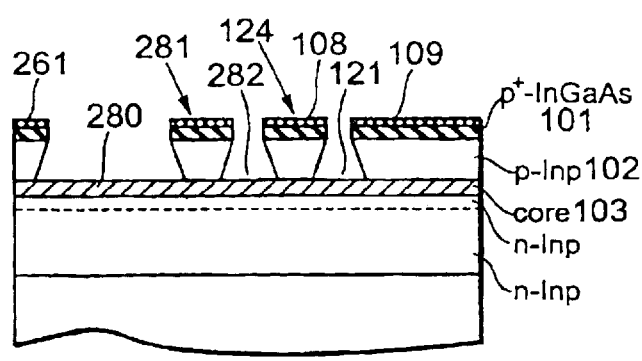
FIG.4(b-4)
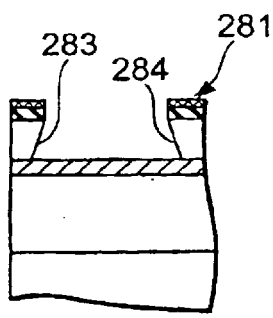
FIG.4(c-4)
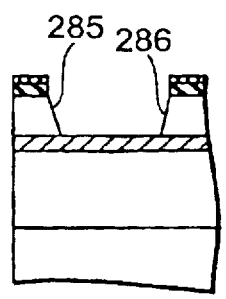
FIG.4(d-4)
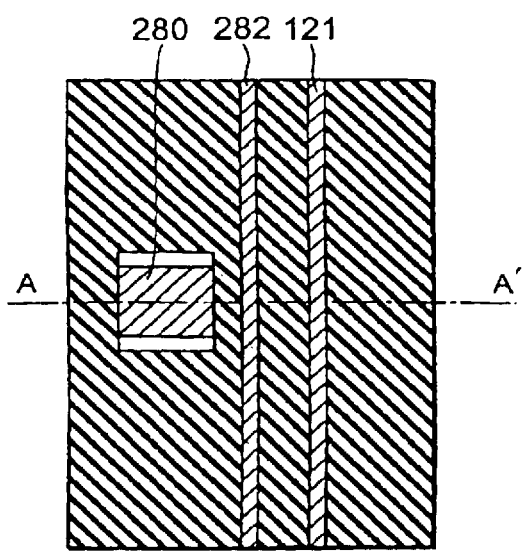
FIG.4(a-5)
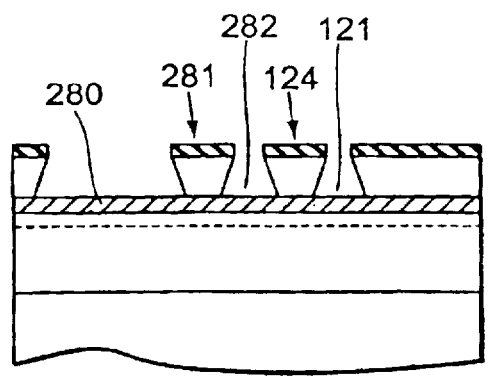
FIG.4(b-5)

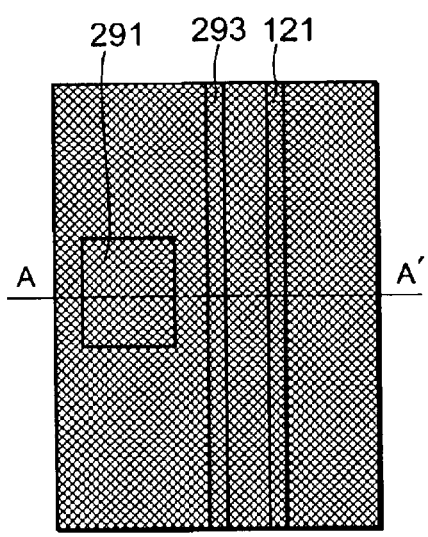
FIG.4 (a-6)
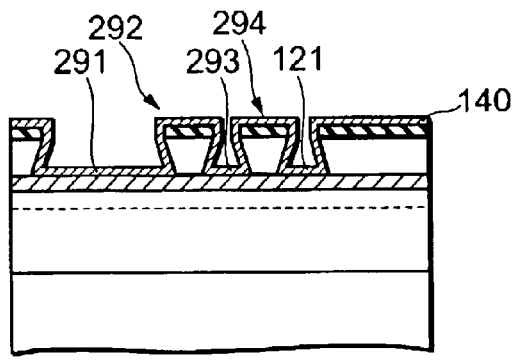
FIG.4(b-6)
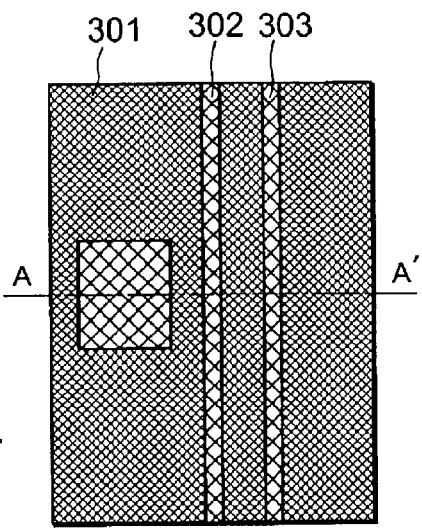
FIG.4 (a-7)
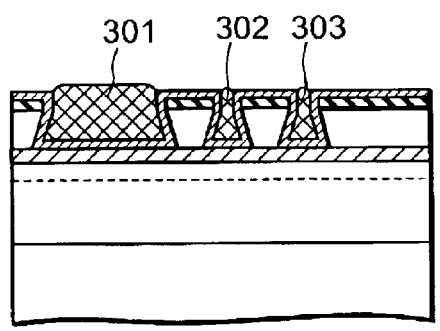
FIG.4(b-7)
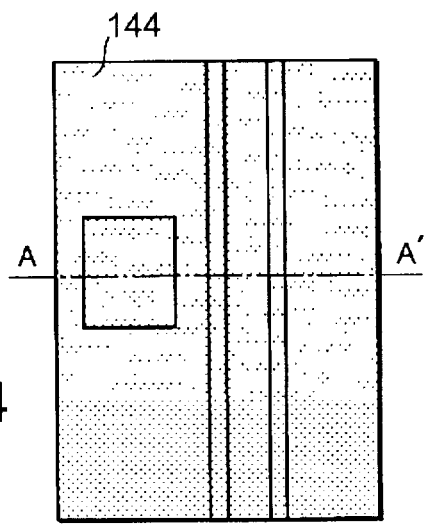
FIG.4 (a-8)
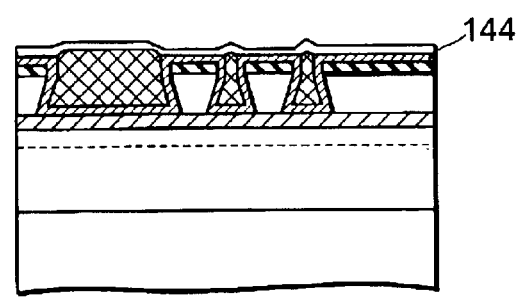
FIG.4(b-8)

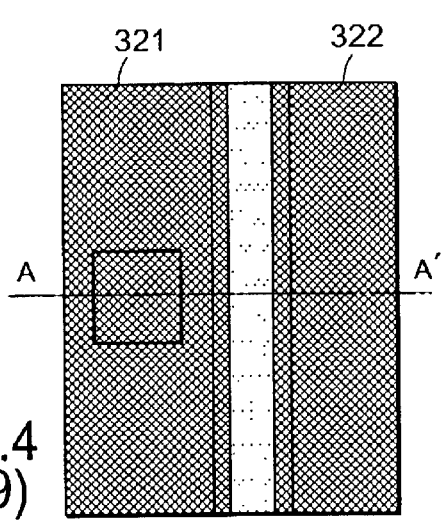
FIG.4 (a-9)
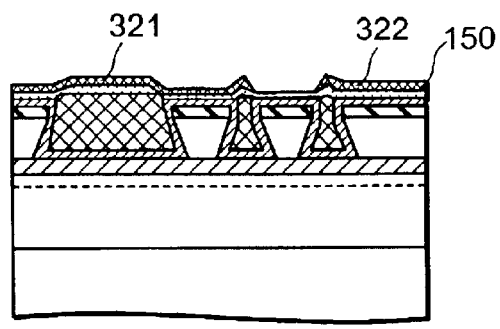
FIG.4(b-9)
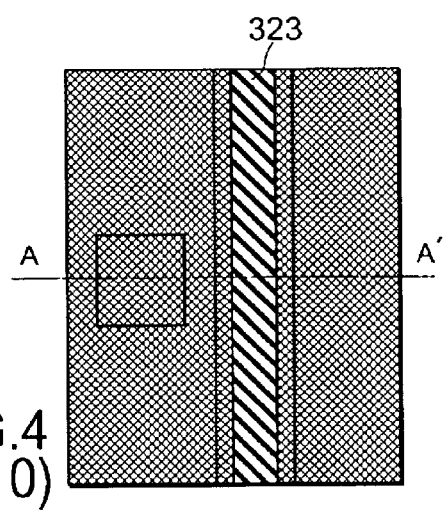
FIG.4 (a-10)
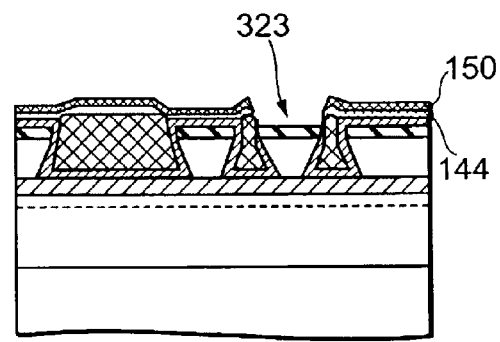
FIG.4(b-10)
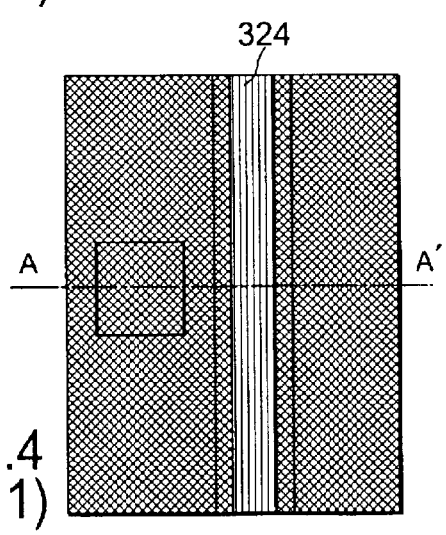
FIG.4 (a-11)
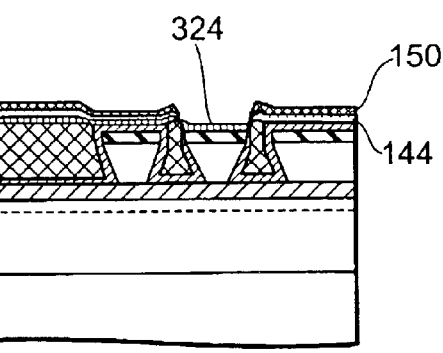
FIG.4(b-11)

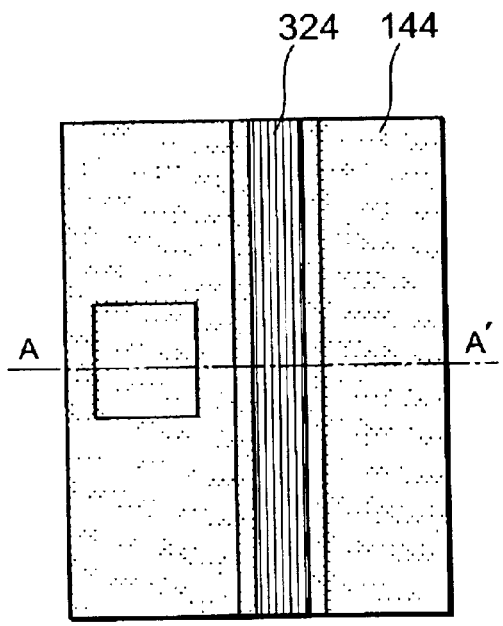
FIG.4(a-12)
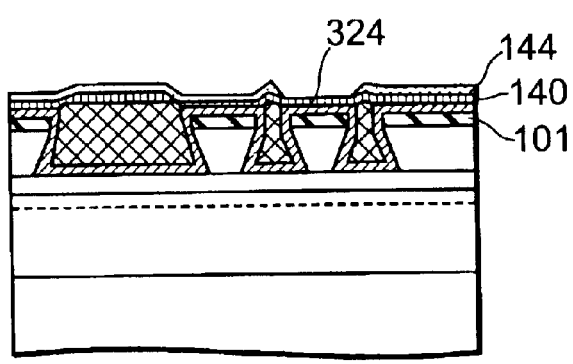
FIG.4(b-12)
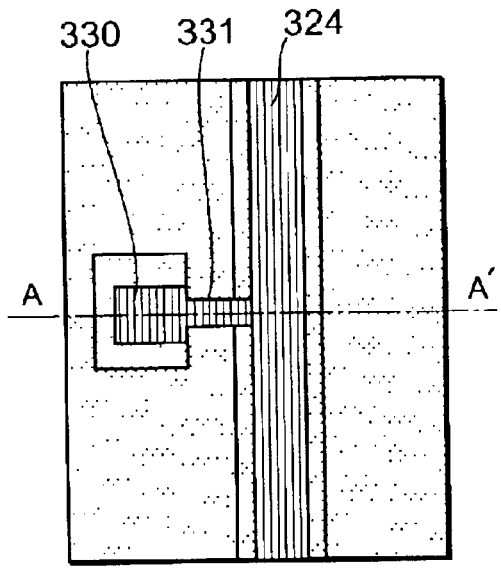
FIG.4(a-13)
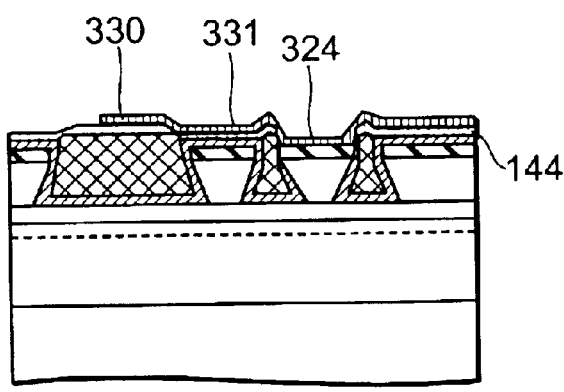
FIG.4(b-13)

METHOD OF MANUFACTURING A WAVEGUIDE OPTICAL SEMICONDUCTOR DEVICE

BACKGROUND OF THE INVENTION

The present invention relates to an under electrode structure used in an optical functional device using a semiconductor and an optical waveguide device, and a manufacturing method thereof.

There has recently been a demand for improvements in the performance of optical devices using semiconductor materials, such as a semiconductor laser, a PD, an optical modulator, an optical amplifier, etc. and reductions in the costs thereof.

Frequency response rated as giga hertz or more in particular has been required to achieve the improvements in performance. Attention has been paid to a ridge type optical waveguide as an optical waveguide structure to meet such a request.

The ridge type optical waveguide is characterized in that control on the width of a mesa stripe is easy in terms of its manufacture, and a structure is provided wherein a solid material having an electrical insulating property and used as a low permittivity material, i.e., an inorganic insulating material such as $SiO_2$, SiN, SiON or the like, or an organic insulating material such as polyimide or the like, or a combination of these inorganic insulating material and organic insulating material is embedded in the sides of the mesa stripe in terms of its structure.

Voltage or current applying means is implemented by, for example, wire-bonding a metal film (rectangle represented in several tens of microns to a few hundred of microns) electrically connected from an upper end of the mesa stripe as viewed from a power feed line. The metal film will hereinafter be called an electrode pad. The ridge type optical waveguide is structurally characterized in that simply forming an organic insulating material such as polyimide or the like thick as an underbed or base for the electrode pad makes it possible to reduce electric capacity (hereinafter called electrode-to-electrode capacitance) between an electrode and GND.

The structure of the ridge type optical waveguide has been described in a typical reference, Yukio Noda, et al., "high-speed electroabsorption modulator stripe-loaded GaInAsP Planer waveguide" IEEE Journal of Lightwave Technology vol. LT-4, No. 10, 1986.

An electrode pad is electrically connected from an upper end of a mesa stripe that functions as an optical waveguide. Further, channel-shaped trenches provided at both ends of the mesa stripe and the lower side of the electrode pad are filled with polyimide having a thickness of about 1 $\mu$. Incidentally, while a layer structure of a semiconductor similar to the mesa stripe is provided outside the trenches as viewed from the mesa stripe, it provides a structure extremely effective in averaging the whole wafer so as to avoid the concentration of a stress on the mesa stripe in a process step or an assembly process, improving process reproducibility, etc. This structure will hereinafter be called a double channel ridge structure (abbreviated as a DC ridge structure). Incidentally, the mesa stripe and the trench lying under the electrode pad are collectively formed in the same process step (removed by etching). While an etching solution such as a hydrochloric acid etchant, an acetic acid etchant or the like is normally used, this is used to selectively etch only InP. Ternary and quaternary compositional layers such as InGaAs or InGaAsP, etc. can be used as etching masks. Namely, an ohmic contact layer corresponding to the top semiconductor layer of the mesa stripe functions as an etching mask, and an optical waveguide functions as an etching stopper layer. Further, the progress of etching in horizontal and vertical directions can automatically be controlled. This results in the feature of a method of manufacturing the ridge type optical waveguide.

Incidentally, the DC ridge type structure has been disclosed even in Japanese Patent Application Laid-Open Nos. 11(1999)-202274 and 07(1995)-230067 and Japanese Patent Application Laid-Open No. Hei 2001-091913.

The conventional structure presents the following problems. Upon etching the p-InP layer, the etching proceeds fast at each projecting corner where the etching layer lying under the electrode and each of the channels on the sides of the mesa stripe join. This results from the fact that the mask does not function as the mask upon etching at the protruding corner. Finally, the etching obliquely proceeds at its point alone. As a result, a $p^+$-InGaAs contact layer used as a mask protrudes.

Thus the conventional structure shows problems about a structural defect, instability of a manufacturing process, etc., such as the following problems:
(a) While the p-InP clad layer is obliquely etched, the angle thereof and the amount of etching thereof are unstable.
(b) The polyimide is hard to enter under the protruding $p^+$-InGaAs (P) contact layer and hence a cavity or void might be defined.
(c) In a subsequent wafer process step, the protruding p-InGaAs(P) contact layer might be chipped.

These problems lead to yield degradation, long-term reliability degradation, and characteristic degradation.

SUMMARY OF THE INVENTION

With the foregoing problems in view, the present invention may provide an under electrode structure and a manufacturing method thereof capable of avoiding instability of an etching angle and the amount of etching.

A method of manufacturing a waveguide optical semiconductor device according to the present invention comprises providing a semiconductor substrate including a lower clad layer, a core layer, an upper clad layer and a contact layer formed on the substrate in that order. Next, the contact layer and a part of the upper clad layer is removed by a dry etching method within a pair of line patterns located in parallel and an independent rectangular pattern located near the line patterns. Then, the remaining upper clad layer is removed by a wet etching method so as to expose the core layer within the line patterns and the independent rectangular pattern. An insulating material is coated on the exposed core layer. Then the insulating material formed on the contact layer is removed within a region located between the pair of line patterns so that a part of the contact layer is exposed. An electrode layer is formed on the exposed contact layer. Finally, a bonding pad layer is formed over the independent rectangular pattern and a part of the electrode layer.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1(a) is a plan view showing a first embodiment of the present invention;

FIG. 1(b) is a cross-sectional view taken along line A–A' of FIG. 1(a);

FIG. 1(c) is a cross-sectional view taken along line B–B' of FIG. 1(a);

FIGS. 4(a-1) through 4(a-13) are respectively plan views showing a fourth embodiment of the present invention;

FIGS. 4(b-1) through 4(b-13) are respectively cross-sectional views taken along lines A–A' of FIGS. 4(a-1) through 4(a-13);

FIG. 4(c-4) is a cross-sectional view taken along line A–A' of an embedding region of FIG. 4(a-4);

FIG. 4(d-4) is a cross-sectional view taken along line C–C' of an embedding region of FIG. 4(a-4);

DETAILED DESCRIPTION OF THE PREFERRED EMBODIMENTS

Figure 2B:
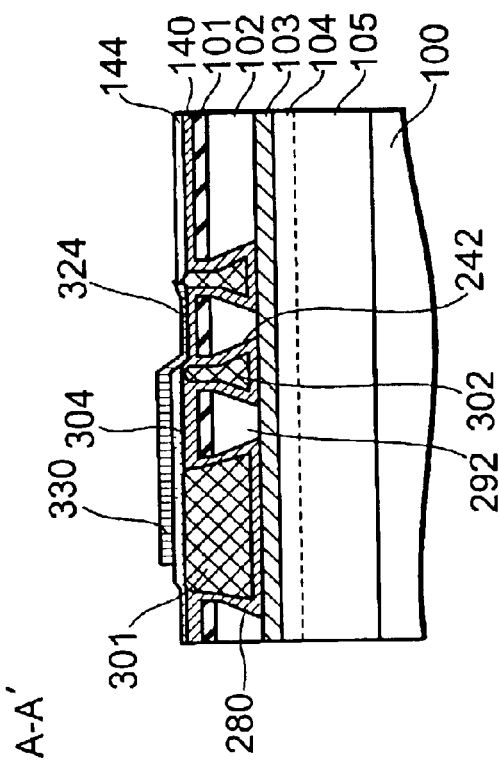
FIG. 2(b) is a cross-sectional view taken along A–A' of FIG. 2(a)

Preferred embodiments of the present invention will hereinafter be described in detail with reference to the accompanying drawings. Incidentally, elements of structure each having the same function and configuration in the following description and accompanying drawings are respectively identified by the same reference numerals, and the description of certain common elements will therefore be omitted.

A first embodiment of the present invention will be described with reference to the accompanying drawings.

FIG. 1 is a configurational diagram of the first embodiment of the present invention, wherein FIG. 1(a) is a plan view, FIG. 1(b) is a cross-sectional view taken along line A–A' of FIG. 1(a), and FIG. 1(c) is a cross-sectional view taken along line B–B' of FIG. 1(a), respectively.

The first embodiment of the present invention is characterized in that a recess or a concave portion 241 formed by etching an electrode-underlying semiconductor layer structure, and trenches 242 and 243 used as channel portions provided on both sides of a mesa stripe 294 are respectively grooves independent of one another, i.e., at least the concave portion 241 and the trench 242 are separated from each other by a trench dividing semiconductor layer 292. There has been a problem in that since the concave portion 241 and the trench 242 take the continuous structure as described above in the prior art, protruding corners appear and are etched in overhung form by wet etching. However, the first embodiment of the present invention is configured in such a manner that the concave portion 241 and the trench 242 are perfectly isolated from each other by the trench dividing semiconductor layer 292 to thereby prevent creation of the protruding corners. Thus, the etching in the overhung form is avoided.

As viewed as a whole, a laminated structure of n-InP clad layers 104 and 105, a core layer 103, a P-InP clad layer 102, a P+-InGaAs layer (a contact layer) 101, and passivation film 140 and 144 is provided on a substrate 100. The concave portion 241 and the trenches 242 and 243 are defined in the P-InP clad layer 102 and the P+-InGaAs layer 101, and polyimide is charged into these through the passivation film 140 to thereby form or make up filler bodies 301, 302 and 303 having low permittivity. The trench dividing semiconductor layer 292 of the non-etched semiconductor layer structure perfectly separates between the concave portion 241 formed by etching the semiconductor layer structure for the under electrode, and the channel-shaped trenches 242 and 243 provided on both sides of the mesa stripe 294, particularly, the trench 242. Further, the two trenches 242 and 243 are closed independent of each other.

The first embodiment brings about the following advantageous effect owing to the adoption of the above-described configuration.

(a) Since no overhangs are formed in an InGaAs(P) contact layer mask, an improvement in the stability of a subsequent process, and yield, specific-stability and reliability enhancements can be achieved.

Further, the following subsidiary effect is also expected in the structure shown in FIG. 1.

(b) When a metal wire is bonded to its corresponding electrode pad so as to straddle an optical waveguide upon bonding the metal wire to its corresponding electrode pad, a trench dividing semiconductor layer serves so as to prevent the metal wire from contacting a metal of the optical waveguide. Thus it is expected that damage of an ultrasonic wave to the optical waveguide upon ultrasonic thermocompression bonding of the metal wire will be able to be suppressed, and hence the enhancement of a characteristic yield can be expected.

A second embodiment of the present invention, i.e., an improved example of the first embodiment will be explained with reference to the accompanying drawings.

Figure 2C:
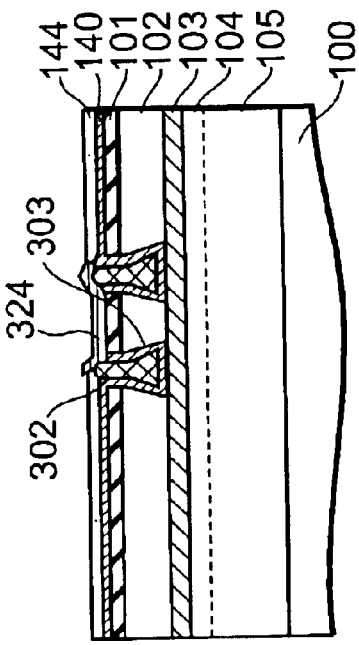
FIG. 2(c) is a cross-sectional view taken along line B–B' of FIG. 2(a)
Figure 2A:
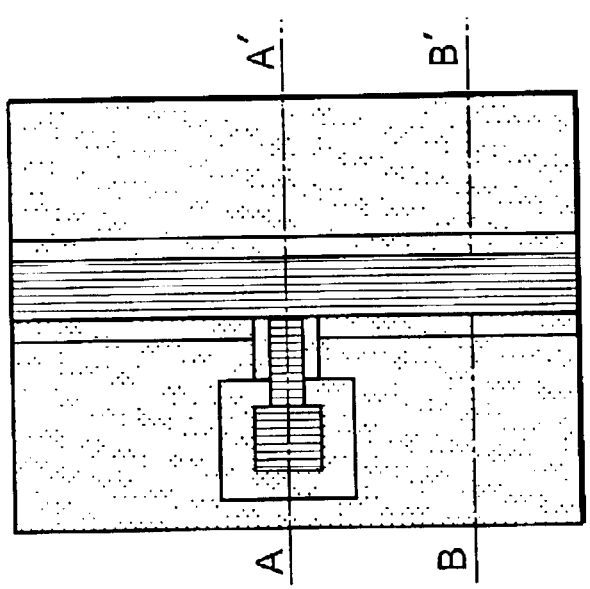
FIG. 2(a) is a plan view showing a second embodiment of the present invention.

FIG. 2 is a configurational diagram of the second embodiment of the present invention, wherein FIG. 2(a) is a plan view, FIG. 2(b) is a cross-sectional view taken along line A–A' in FIG. 2(a), and FIG. 2(c) is a cross-sectional view taken along line B–B' in FIG. 2(a), respectively.

The second embodiment is characterized in that in the first embodiment, a polyimide coating film 304 connected to a polyimide filler body 301 and a polyimide filler body 302 is formed even on a first passivation film 140 for an inverted mesa-shaped portion 292 lying between a trench 242 and a concave portion 280.

A process for performing coating simultaneously when polyimide is charged into the trenches 242 and 243 and the concave portion 280, thereby forming a pattern is adopted to form the polyimide coating film 304.

The second embodiment obviously brings about the effect brought from the first embodiment. However, the second embodiment brings about an additional effect in that even if a metal material obtains entrance into the passivation film 140 to thereby cause a variation in apparent electrode thickness and heat is generated due to the occurrence of variations in resistance value, when bonding pads and wiring portions are formed by metal deposition, the influence thereof on a light emitting region can be lessened owing to the provision of the polyimide coating film 304.

A third embodiment of the present invention will be described with reference to the accompanying drawings.

Figure 3B:
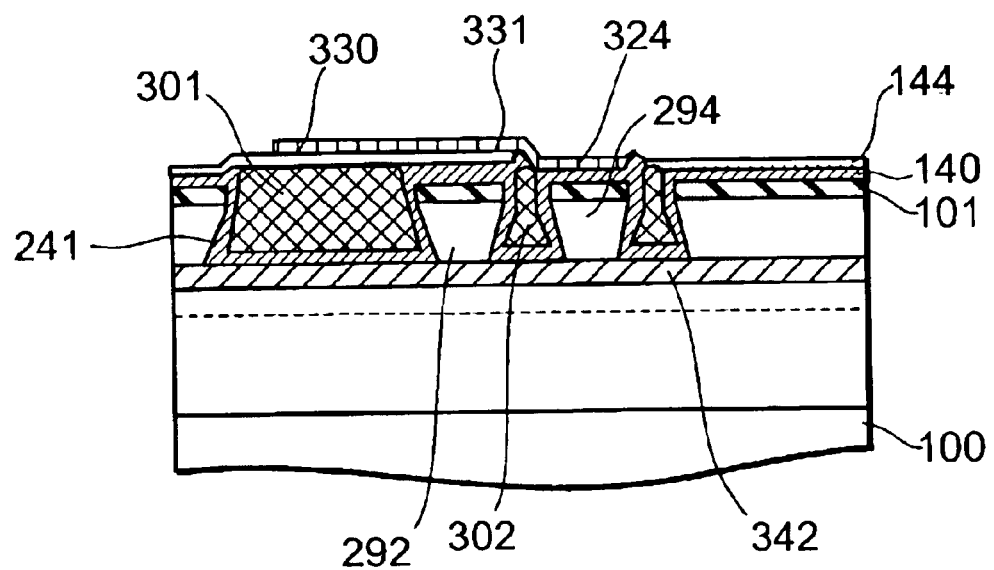
FIG. 3(b) is a cross-sectional view taken along line A–A' of FIG. 3(a)
Figure 3A:
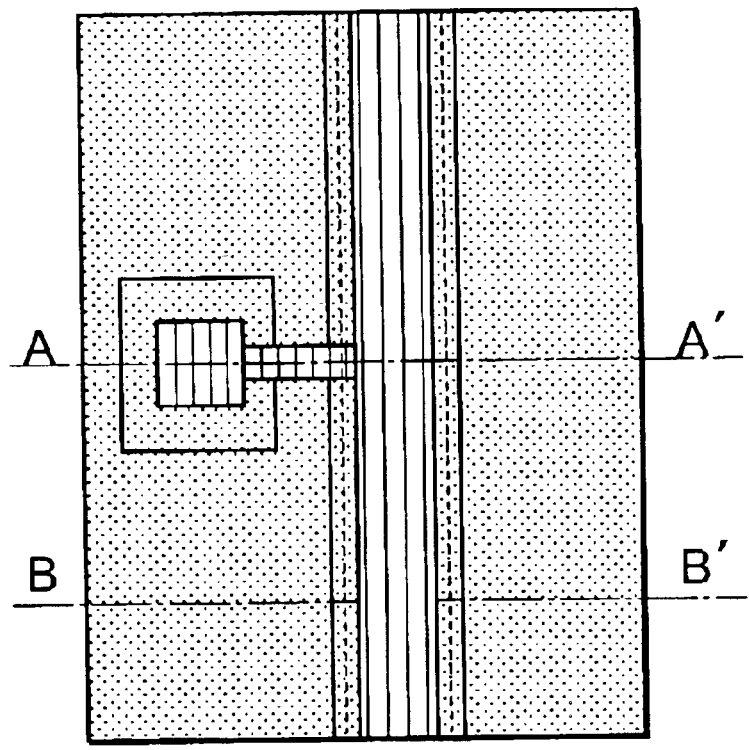
FIG. 3(a) is a plan view illustrating a third embodiment of the present invention.

FIG. 3 is a configurational diagram of the third embodiment of the present invention, wherein FIG. 3(a) is a plan view and FIG. 3(b) is a cross-sectional view taken along A–A' in FIG. 3(a), respectively.

The feature of the third embodiment resides in a further improvement in the structure of the first embodiment. Namely, the third embodiment is characterized in that as to a mesa stripe constituted by a trench dividing semiconductor layer structure 292, its structural parameters are made different from structural parameters of an optical waveguide. The structural parameters described herein include the width of the mesa stripe (width of p-InP clad layer), an internal structure (composition, refractive index, thickness, difference between a bulk and a MOW (Multi quantum well), etc.) of a core layer, or even structures extending in their optical waveguide directions.

When the optical waveguide 294 and the trench dividing semiconductor layer 292 are identical in layer structure and the two structures are equal in width, two mesa stripes will raise the possibility of constituting a directional coupling waveguide.

Namely, light waveguided within the optical waveguide 294 is coupled to the trench dividing semiconductor layer 292 to thereby cause a reduction in optical output and a growth in instability. This results in excursions or deviations out of the role of the trench dividing semiconductor layer 292. Thus it is necessary to reduce an optical coupling constant between the mesa of the trench dividing semiconductor layer 292 and that of the optical waveguide 294 for the purpose of avoiding the occurrence of such a reduction. To this end, making the structural parameters of the two different from each other is effective. In the case of an actually fabricated elemental device, a stripe width of an optical waveguide was set to about 2 $\mu$m, and a ten-layer InGaAsP/InGaAsP type MQW structure 342 was used as a core layer. A stripe width of a mesa stripe constituted by a trench dividing semiconductor structure was set to about 5 $\mu$, and an InGaAsP bulk structure 342 was used as a core layer. Further, a channel width was set to 11 $\mu$. No optical coupling phenomenon appeared from the result of the fabrication of the present device.

The third embodiment is capable of suppressing the leakage of light into the trench dividing semiconductor layer 292 in addition to the effect of the first embodiment.

A fourth embodiment is intended for the description of a process for manufacturing the first embodiment.

The fourth embodiment is characterized in that channels on the sides of an optical waveguide, and a concave portion formed by etching a semiconductor layer structure for an under electrode are removed in a lump by etching in the same process.

The manufacturing process of the first embodiment according to the present invention will be described below in detail.

FIGS. 4(a-1) and 4(b-1) are respectively process views for growing respective layers on a semiconductor substrate as crystals, wherein FIG. 4(a-1) is a plan view, and FIG. 4(b-1) is a cross-sectional view taken along line A–A' of FIG. 4(a-1), respectively.

As shown in FIG. 4(b-1), an n-InP layer 106 used as a lower clad layer is formed on a substrate 100. The n-InP layer 106 constitutes a layer 105 high in carrier concentration on the substrate side, and a layer 104 low in carrier concentration on the upper side. A core layer 103 is formed on the n-InP layer 106. A p-InP layer 102, which is used as an upper clad layer, is formed on the core layer 103. A p$^+$-InGaAs layer 101 is formed on the p-InP layer 102.

As shown in FIGS. 4(a-2) and 4(b-2), a mask material is spin-coated to form a mask, which in turn is subjected to photolithography to form mask patterns 108, 109 and 261 provided with openings corresponding to channel regions on the sides of a mesa stripe and a concave region placed under a bonding pad. SiO$_2$, Si$_x$N$_y$, etc. are suitably selected and used as the mask. The openings result in linear openings 112 and 262 corresponding to the channel regions on the sides of the mesa stripe, and an opening 260 corresponding to an embedding region placed under the bonding pad.

As shown in FIGS. 4(a-3) and 4(b-3), a p$^+$-InGaAs layer 101 is dry-etched to make penetration. Vertically-extending openings 114 and 272 and an opening 270 corresponding to the embedding region placed under the bonding pad respectively extend through the p$^+$-InGaAs layer 101 in pattern forms defined for the mask patterns 108, 109 and 261 and are defined in concave form up to points located midway through the upper clad layer (p-InP layer) 102.

As shown in FIGS. 4(a-4), 4(b-4), 4(c-4) and 4(d-4), only the p-InP layer 102 is wet-etched with the pattern-formed masks 108, 109 and 261 and the pattern-formed p$^+$-InGaAs layer 101 as masks.

As a result, a ridge channel-shaped mesa stripe 124 having an inverted mesa shape is formed by linear trenches 121 and 282 provided on both sides.

Simultaneously, a concave portion 280 corresponding to the embedding region placed under the bonding pad is etched to inverted mesa-shaped surfaces 283 and 284 by etching as shown in FIG. 4(c-4) as viewed in the form of a cross section taken along line A–A' of FIG. 4(a-4). Identically, the concave portion 280 is etched to mesa-shaped surfaces 285 and 286 as shown in FIG. 4(d-4) as viewed in the form of a cross-section taken along line C–C' of FIG. 4(a-4). For removing InP layer, an etchant would be chosen from a group of H$_3$PO$_4$, HCl, HBr, CH$_3$COOH and H$_2$O. The etchant may be a single material of the above group or combined from the above group.

In the present invention, the trench 282 and the concave portion 280 are defined so as to be isolated in several. Thus when the region in which the corners will appear in the conventional example, is wet-etched, etching is put forward more than expected. Further, no regularity appears in the degree of advance of the etching. As a result, it is possible to avoid such a phenomenon that the thickness of a p-InP layer 102 lying in the neighborhood of a protruding intersection shows a tendency to become extremely thinner than expected. Namely, solving means for making a change to such a structure as not to cause the problem is eventually adopted.

As shown in FIGS. 4(a-5) and 4(b-5), the mask patterns 108, 109 and 261 are removed. At this time, the point where the thickness of the p-InP layer located in the vicinity of the intersection is extremely thinner than expected as in the conventional example, is prevented from breaking due to a stress applied upon mask removal.

As shown in FIGS. 4(a-6) and 4(b-6), a first passivation film 140 is coated over the whole surface after the mask removal in the above process step. The film is formed along trenches 121 and 293 and a concave portion 291. While SiO$_2$ is used as a material for the film, another Si$_x$N$_y$ may be used.

As shown in FIGS. 4(a-7) and 4(b-7), a polyimide resin is spin-coated over the entire surface to form patterns along the trenches 121 and 293 and the concave portion 291 by photolithography. The polyimide resin is heat-treated so as to reach vitrification, thereby forming filler bodies 301, 302 and 303. The polyimide resin is used to reduce capacitance placed below an electrode. Further, the polyimide resin is low in dielectric constant and has water absorbing property and high viscosity. When the polyimide resin is heated, it expands.

Since the polyimide resin has such high viscosity, it is less poured around upon coating and hard to enter inner points like the edge of the corner, etc., in particular. When the polyimide resin is heated for heat treatment, a lean point such as a thin point etched, i.e., overhung excessively more than expected due to the expansion of the resin as in the case of the corner, might be damaged due to its stress. However, the present invention does not cause such a problem as described above since the trench 293 and the concave portion 291 are respectively formed away from each other.

As shown in FIGS. 4(a-8) and 4(b-8), a second passivation film 144 is coated over the whole surface. While $Si_xN_y$ is used as a film material, another $SiO_2$ may be used.

The second passivation film 144 coats the polyimide filler bodies 301, 302 and 303 in cooperation with the first passivation film 140. This coating prevents the occurrence of constraints on the water-absorbing polyimide filler bodies 301, 302 and 303 in a process step subsequent to the above step.

As shown in FIGS. 4(a-9) and 4(b-9), a mask 150 is coated over the whole surface and an opening corresponding to the width of an electrode above a mesa stripe 294 is formed in a pattern by photolithography, whereby mask patterns 321 and 322 are formed.

As shown in FIGS. 4(a-10) and 4(b-10), the second passivation film 144 is etched with the mask patterns 321 and 322 of the mask 150 to define an opening 323.

As shown in FIGS. 4(a-11) and 4(b-11), an electrode 324 is vapor-deposited on the $p^+$-InGaAs layer 101 in association with the opening 323 defined by above etching.

Afterwards, the mask 150 is removed as shown in FIGS. 4(a-12) and 4(b-12).

Finally, a bonding pad 330 and a wiring portion 331 provided between the electrode 324 and the bonding pad 330 are formed on the second passivation film 144 and part of the electrode 324 from the electrode 324 to the polyimide filler body 301 by vapor deposition as shown in FIGS. 4(a-13) and 4(b-13).

The concave portion 280 formed by etching the semiconductor layer structure for the under electrode, and the channel-shaped trenches 121 and 282 provided on the sides of the mesa stripe 124 are isolated from and become independent of each other as described above. Thus the present embodiment can be designed so that the protruding corners described as the drawback of the conventional example will not appear in the shapes of the two trenches 121 and 282.

Owing to the above design, the present embodiment results in a structure wherein the overhang extended with the InGaAs(P) contact layer 101 employed in the conventional example as the mask is not formed either.

The overhang does not definitely appear in an actually-formed device and hence an extremely uniform wafer process can be implemented.

Discussion was made even to the influence of the trench dividing semiconductor layer 281 on a frequency characteristic. Thus it was confirmed that there was no noticeable difference in fact as a result of a comparison between frequency characteristics of a device defined as 2 $\mu$ in the width of its optical waveguide, 11 $\mu$ in the width of its channel and 5 $\mu$ in the width of its trench dividing semiconductor layer (present embodiment) and a 0-$\mu$ device (conventional example).

According to the first and second embodiments, since the channels provided on both sides of the optical waveguides and the concave portions formed by etching the semiconductor structures for the under electrodes are respectively of the isolated and independent structures, they can be formed in discrete processes.

However, since the patterns are formed on the same mask, they can collectively be removed in the same process step by etching.

A fourth embodiment is capable of shortening and simplifying steps for a wafer process. In its turn, the present embodiment can be expected to obtain a cost reduction and yield enhancement.

The present invention is intended for a semiconductor optical device as described above, i.e., one having a double channel structure and wherein a trench immediately under an electrode and at least one trench of trenches provided on the sides of a mesa stripe are connected to each other.

Thus the present invention is applicable to many optical devices each having the intended construction referred to above. As such devices, may be mentioned, for example, a semiconductor optical modulator, a semiconductor laser obtained by bringing it into integration, a mode lock laser, an optical amplifier, a photodiode, a supersaturated absorption light switch, an optical switch for inducing a change in refractive index, etc.

Since the conventional overhang extended with the InGaAs(P) contact layer as the mask is not formed, an improvement in stability, and yield, special stability and reliability enhancements can be achieved in a subsequent process.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a waveguide optical semiconductor device comprising:

forming a lower clad layer on a substrate;

forming a core layer on the lower clad layer;

forming an upper clad layer on the core layer;

forming a contact layer on the upper clad layer;

selectively forming a mask layer on the contact layer, said mask layer exposing a pair of line patterns located in parallel and an independent rectangular pattern located near the line patterns;

removing the contact layer and a part of the upper clad layer by a dry etching method using the mask layer;

removing the upper clad layer by a wet etching method using the mask layer so as to form a mesa stripe channel structure and to expose the core layer;

coating an insulating material on the exposed core layer and on the contact layer;

removing the insulating material formed on the contact layer of the mesa stripe channel structure;

forming an electrode layer on the contact layer of the mesa stripe channel structure; and forming a bonding pad layer extending from the independent rectangular pattern to the electrode layer.

2. A method of manufacturing a waveguide optical semiconductor device according to claim 1, further comprising forming a first insulating layer on the upper clad layer and the contact layer exposed during said removing the upper clad layer, before coating the insulating material.

3. A method of manufacturing a waveguide optical semiconductor device according to claim 1, further comprising
forming a second insulating layer on the coated insulating material.

4. A method of manufacturing a waveguide optical semiconductor device according to claim 1, wherein
the lower clad layer is an n type InP layer;
the upper clad layer is a p type InP layer; and
the contact layer is a p+ type InGaAs layer.

5. A method of manufacturing a waveguide optical semiconductor device according to claim 1, wherein the insulating material is polyimide.

6. A method of manufacturing a waveguide optical semiconductor device according to claim 1, wherein said wet etching is performed by using an etchant that includes a material chosen from a group consisting of $H_3PO_4$, HCl, HBr, $CH_3COOH$ and $H_2O$.

7. A method of manufacturing a waveguide optical semiconductor device comprising:
providing a semiconductor substrate including a lower clad layer formed thereon, a core layer formed on the lower clad layer, an upper clad layer formed on the core layer and a contact layer formed on the upper clad layer;
selectively removing the contact layer and a part of the upper clad layer by a dry etching method within a pair of line patterns located in parallel and an independent rectangular pattern located near the line patterns;
removing the upper clad layer by a wet etching method so as to expose the core layer within the line patterns and the independent rectangular pattern;
coating an insulating material on the exposed core layer and the contact layer;
removing the insulating material formed on the contact layer within a region located between the pair of line patterns so that a part of the contact layer is exposed;
forming an electrode layer on the exposed contact layer; and
forming a bonding pad layer over the independent rectangular pattern and a part of the electrode layer.

8. A method of manufacturing a waveguide optical semiconductor device according to claim 7, further comprising
forming a first insulating layer on the exposed core layer and the contact layer before coating the insulating material.

9. A method of manufacturing a waveguide optical semiconductor device according to claim 7, further comprising
forming a second insulating layer on the coated insulating material.

10. A method of manufacturing a waveguide optical semiconductor device according to claim 7, wherein
the lower clad layer is an n type InP layer;
the upper clad layer is a p type InP layer; and
the contact layer is a p+ type InGaAs layer.

11. A method of manufacturing a waveguide optical semiconductor device according to claim 7, wherein the insulating material is polyimide.

12. A method of manufacturing a waveguide optical semiconductor device according to claim 7, wherein said wet etching is performed by using an etchant that includes a material chosen from a group consisting of $H_3PO_4$, HCl, HBr, $CH_3COOH$ and $H_2O$.

13. A method of manufacturing a waveguide optical semiconductor device according to claim 7, wherein the upper clad layer within the region has a reversed mesa structure.

14. A method of manufacturing a ridge type optical waveguide device comprising:
providing a semiconductor substrate including a lower clad layer, a core layer, an upper clad layer and a contact layer formed on the semiconductor substrate in order;
forming a mask layer on the contact layer, the mask layer having a plurality of openings to expose the contact layer, the openings including a pair of line patterns located in parallel and an independent rectangular pattern located near the line patterns;
selectively dry etching the contact layer and a part of the upper clad layer using the mask layer so that the contact layer and part of the upper clad layer is removed vertically within the line patterns;
wet etching the upper clad layer using the mask layer so as to expose the core layer within the line patterns;
removing the mask layer;
coating an insulating material on the exposed core layer and the contact layer;
removing the insulating material formed on the contact layer within a region located between the pair of line patterns so that a part of the contact layer is exposed;
forming an electrode layer on the exposed contact layer; and
forming a bonding pad layer over the independent rectangular pattern and a part of the electrode layer.

15. A method of manufacturing a ridge type optical waveguide device according to claim 14, further comprising
forming a first insulating layer on the exposed core layer and the contact layer before coating the insulating material.

16. A method of manufacturing a ridge type optical waveguide device according to claim 14, further comprising
forming a second insulating layer on the coated insulating material.

17. A method of manufacturing a ridge type optical waveguide device according to claim 14, wherein
the lower clad layer is an n type InP layer;
the upper clad layer is a p type InP layer; and
the contact layer is a p+ type InGaAs layer.

18. A method of manufacturing a ridge type optical waveguide device according to claim 14, wherein the insulating material is polyimide.

19. A method of manufacturing a ridge type optical waveguide device according to claim 14, wherein said wet etching is performed by using an etchant that includes a material chosen from a group consisting of $H_3PO_4$, HCl, HBr, $CH_3COOH$ and $H_2O$.

20. A method of manufacturing a ridge type optical waveguide device according to claim 14, wherein the upper clad layer within the region has a reversed mesa structure.

* * * * *